US012046655B2

(12) United States Patent
Patti et al.

(10) Patent No.: US 12,046,655 B2
(45) Date of Patent: Jul. 23, 2024

(54) VERTICAL CONDUCTION ELECTRONIC POWER DEVICE HAVING A REDUCED ON RESISTANCE AND MANUFACTURING PROCESS THEREOF

(71) Applicant: STMicroelectronics S.r.l., Agrate Brianza (IT)

(72) Inventors: Davide Giuseppe Patti, Mascalucia (IT); Mario Giovanni Scurati, Milan (IT); Marco Morelli, Bareggio (IT)

(73) Assignee: STMICROELECTRONICS S.r.l., Agrate Brianza (IT)

(*) Notice: Subject to any disclaimer, the term of this patent is extended or adjusted under 35 U.S.C. 154(b) by 21 days.

(21) Appl. No.: 17/161,059

(22) Filed: Jan. 28, 2021

(65) Prior Publication Data
US 2021/0242323 A1   Aug. 5, 2021

(30) Foreign Application Priority Data
Jan. 31, 2020 (IT) .................. 102020000001942

(51) Int. Cl.
  *H01L 29/45*   (2006.01)
  *H01L 21/285*  (2006.01)
  *H01L 29/10*   (2006.01)
  *H01L 29/66*   (2006.01)
  *H01L 29/78*   (2006.01)

(52) U.S. Cl.
  CPC ........ *H01L 29/45* (2013.01); *H01L 21/28518* (2013.01); *H01L 29/1095* (2013.01); *H01L 29/66734* (2013.01); *H01L 29/7813* (2013.01)

(58) Field of Classification Search
  CPC .......... H01L 29/66734; H01L 29/7813; H01L 29/7802; H01L 29/41741; H01L 29/71766; H01L 29/0657; H01L 29/0696
  See application file for complete search history.

(56) References Cited

U.S. PATENT DOCUMENTS

| 6,693,024 B2 | 2/2004 | Lehmann et al. | |
|---|---|---|---|
| 2002/0197832 A1 | 12/2002 | Lehmann et al. | |
| 2007/0272980 A1 | 11/2007 | Magri et al. | |
| 2009/0189222 A1* | 7/2009 | Shino | H01L 29/7841 257/E27.084 |
| 2012/0313162 A1 | 12/2012 | Matsuda et al. | |
| 2014/0048904 A1* | 2/2014 | Zundel | H01L 27/0629 438/585 |

(Continued)

FOREIGN PATENT DOCUMENTS

EP   3 396 718 A1   10/2018

*Primary Examiner* — Samuel A Gebremariam
*Assistant Examiner* — Jonas T Beardsley
(74) *Attorney, Agent, or Firm* — Seed IP Law Group LLP

(57) ABSTRACT

A vertical conduction electronic power device includes a body delimited by a first and a second surface and having an epitaxial layer of semiconductor material, and a substrate. The epitaxial layer is delimited by the first surface of the body and the substrate is delimited by the second surface of the body. The epitaxial layer houses at least a first and a second conduction region having a first type of doping and a plurality of insulated-gate regions, which extend within the epitaxial layer. The substrate has at least one silicide region, which extends starting from the second surface of the body towards the epitaxial layer.

18 Claims, 5 Drawing Sheets

(56) References Cited

U.S. PATENT DOCUMENTS

| | | | |
|---|---|---|---|
| 2014/0225126 A1* | 8/2014 | Aketa | H01L 29/7397 257/77 |
| 2016/0372572 A1 | 12/2016 | Fung et al. | |
| 2020/0258996 A1* | 8/2020 | Ohse | H01L 21/0485 |

* cited by examiner

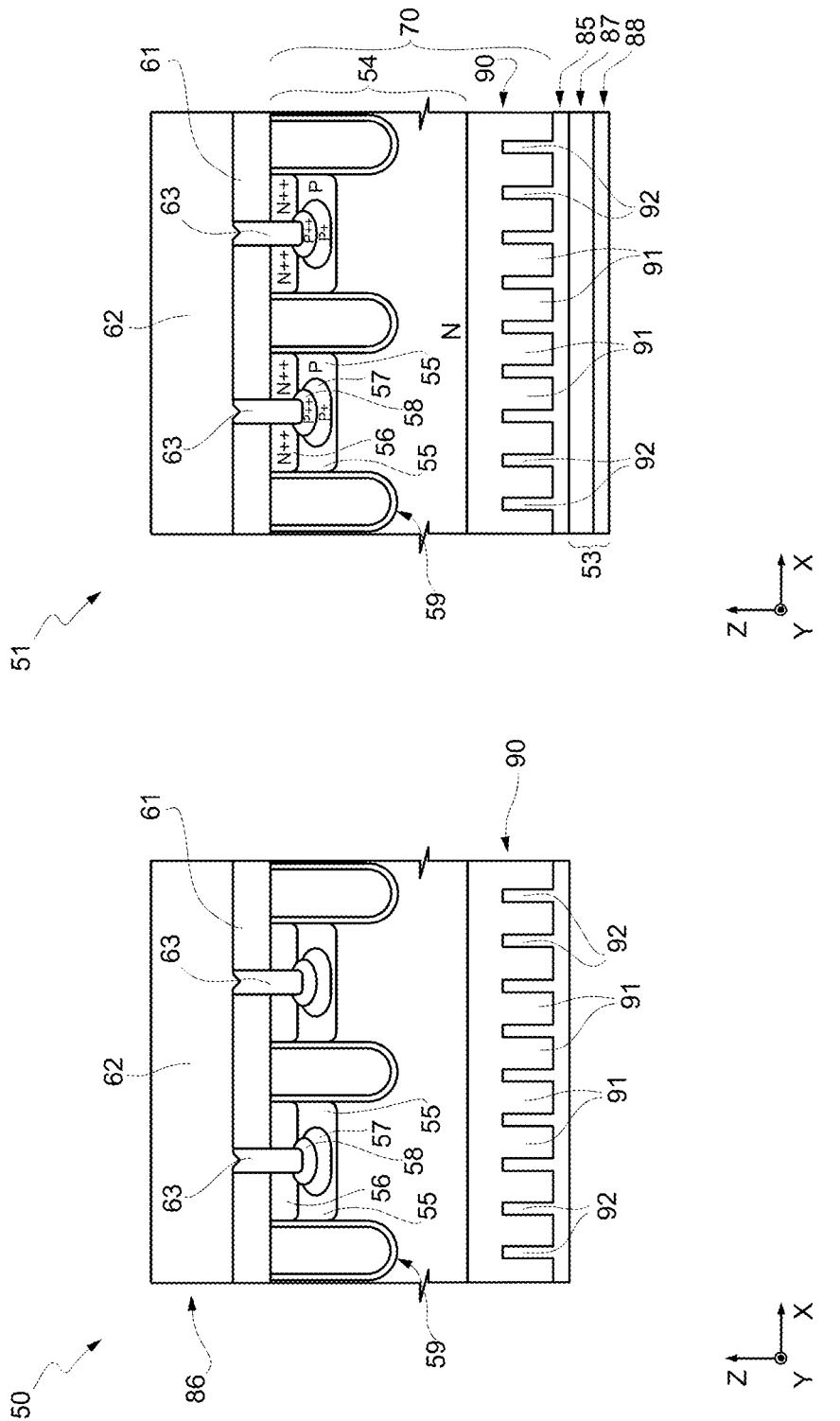

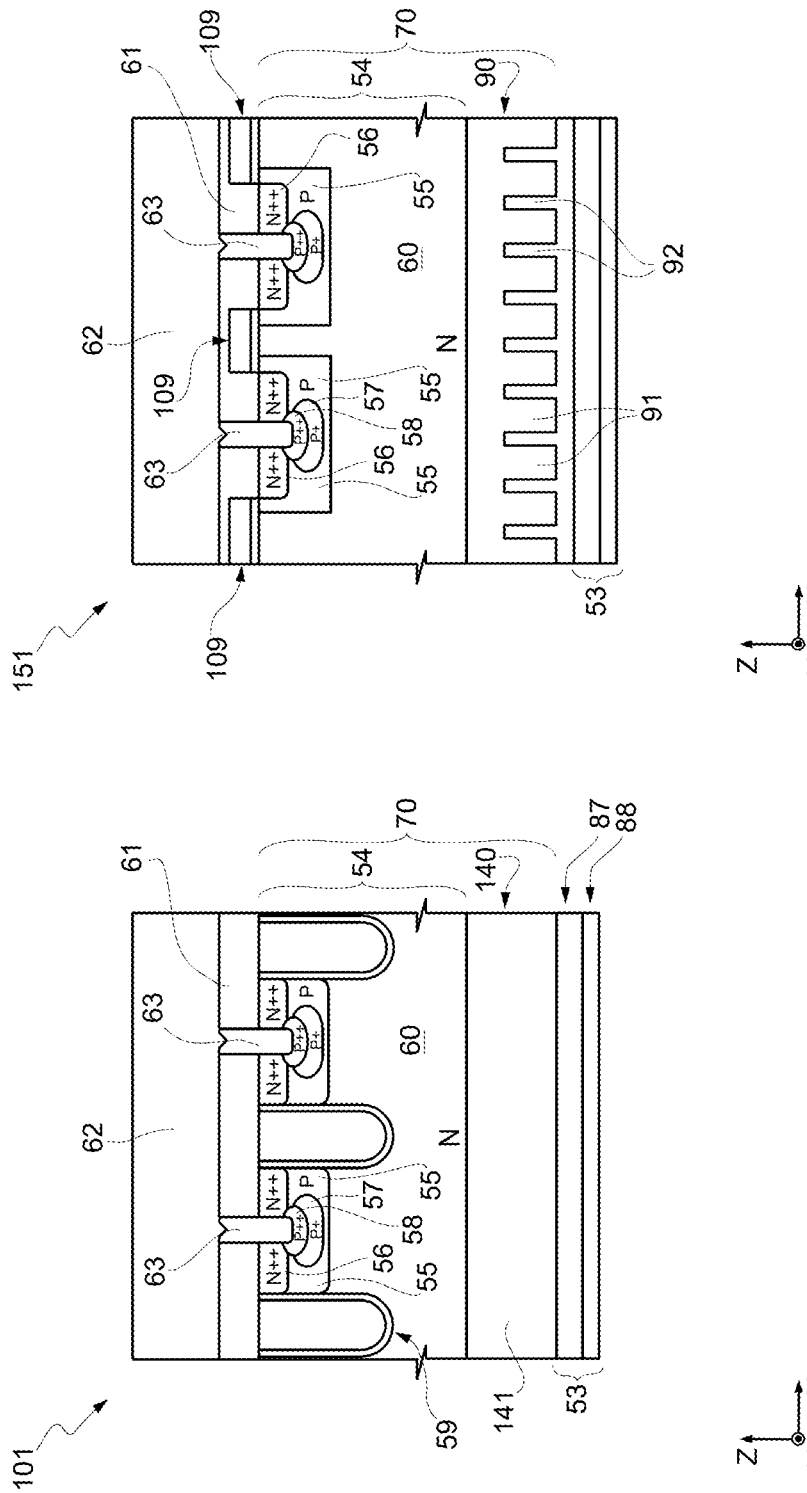

VERTICAL CONDUCTION ELECTRONIC POWER DEVICE HAVING A REDUCED ON RESISTANCE AND MANUFACTURING PROCESS THEREOF

BACKGROUND

Technical Field

The present disclosure relates to a vertical conduction electronic power device having a reduced ON resistance and to the manufacturing process thereof. In particular, hereinafter reference will be made to a MOSFET device.

Description of the Related Art

As is known, power MOSFETs, especially vertical conduction MOSFETs, are electronic devices characterized, for example, by their high switching speed, high energy efficiency and ease of manufacture and integration. Consequently, they are currently widely used in various electronic systems.

In particular, such electronic systems may be divided into two categories, for low or high voltages, according to a value of reference voltage level.

For low-voltage applications, for example, for reference voltages levels lower than 200V typically used in electrical power-supply systems, DC-DC converters and engine control units, it is desired that, during operation, a current path between the source terminal and the drain terminal of the electronic device has a drain-to-source ON resistance $R_{DSon}$ (hereinafter, also referred to as ON resistance $R_{DSon}$) that is as low as possible so as to limit energy consumption.

One of the possible implementations of vertical conduction power MOSFET devices comprises providing trench-gate terminals, as illustrated in the cross-sectional view of FIG. 1.

A vertical conduction power MOSFET device 1 with trench-gate terminals is generally formed by a plurality of structures that are the same as one another, which are arranged in parallel in a same die and only a part of which is illustrated in FIG. 1.

The MOSFET device 1 is formed in a body 20 of semiconductor material having a first and a second surface 20A, 20B and comprising a substrate 2 and an epitaxial layer 4, superimposed to each other.

The substrate 2 has a first type of doping, being made, for example, of N-doped silicon, typically with a thickness of 250 μm and forms the second surface 20B of the body 20.

A bottom metallization region, typically formed by a stack of layers of conductive materials such as titanium, nickel and gold, extends underneath the second surface 20B of the body 20, in electrical contact therewith and forms a drain terminal 3 constituting a conduction terminal of the MOSFET device 1.

Also the epitaxial layer 4 has the first type of doping, for example, N-doped silicon, with a doping level lower than that of the substrate 2.

The epitaxial layer 4 houses a plurality of active regions 5, a plurality of source regions 6, a plurality of first and second enriched regions 7, 8, a plurality of insulated-gate regions 9 and a drift region 10.

In detail, the insulated-gate regions 9 extend through the epitaxial layer 4, along a first axis Z of a Cartesian reference system XYZ, starting from the first surface 20A of the body 20 and comprise a portion 9A of conductive material, for example, polysilicon, and an insulating layer 9B, for example, of silicon oxide. The insulating layer 9B surrounds the portion 9A to electrically insulate it from the epitaxial layer 4. The insulated-gate regions 9 are moreover mutually spaced along a second axis X of the reference system XYZ.

Each source region 6 extends starting from the first surface 20A, within the epitaxial layer 4, for a smaller depth than the insulated-gate regions 9 (along the first axis Z), and along the second axis X covers the distance that separates two adjacent insulated-gate regions 9. Furthermore, each source region 6 has the first type of doping, here a doping of an N-type, with a doping level much higher than the doping level of the epitaxial layer 4, for example, greater than $10^{19}$ atoms/cm$^3$.

Each active region 5 extends underneath the source regions 6, for a smaller depth, along the first axis Z, than the insulated-gate regions 9. Each active region 5 covers, along the second axis X, the distance that separates two adjacent insulated-gate regions 9 and has a second type of doping, here a doping of a P-type.

Each first enriched region 7 is arranged inside a respective active region 5 and has the second type of doping, here a doping of a P-type, with a doping level higher than that of the active regions 5, for example, higher than $5 \cdot 10^{17}$ atoms/cm$^3$.

Each second enriched region 8 is arranged approximately inside a respective active region 5 and is in contact at the top with a respective source region 6 and underneath with a respective first enriched region 7. Each second enriched region 8 moreover has the second type of doping, here a doping of a P-type, with a doping level higher than that of the first enriched regions 7.

The portion of the epitaxial layer 4 arranged between the substrate 2 and the active regions 5 (as well as the insulated-gate regions 9) forms the drift region 10.

The device also has a top metallization region of conductive material, for example, aluminium, which forms a source terminal 12 and constitutes a further conduction terminal of the MOSFET device 1; a dielectric insulation region 11, for example, of silicon oxide or borophosphosilicate glass (BPSG) and a plurality of metal contact regions 13, of conductive material, for example, tungsten.

The dielectric insulation region 11 is arranged on the first surface 20A of the body 20, and the source terminal 12 is arranged above the dielectric insulation region 11. In this way, the dielectric insulation region 11 electrically insulates the source terminal 12 from the epitaxial layer 4.

Each metal contact region 13 extends along the first axis Z, between and in direct electrical contact with the source terminal 12 and a respective second enriched region 8, traversing the dielectric insulation region 11 and a respective source region 6.

The source terminal 12, the metal contact regions 13, and the first and second enriched regions 7, 8, form an input region 14 of the MOSFET device 1 characterized by an input resistance Rin.

The source regions 6, together with respective portions of active regions 5, form a channel region 15 having a channel resistance Rc. The drain terminal 3 moreover has an output resistance Ro, the drift region 10 has a drift resistance Rd, and the substrate 2 has a substrate resistance Rs.

In use, the MOSFET device 1 switches between a first phase, the OFF phase, and a second phase, the ON phase, in a way depending upon the biasing voltage applied to the insulated-gate regions 9.

In the ON phase, a vertical conductive channel is formed along the first axis Z in each active region 5, electrically closing the current path existing between the source terminal 12 and the drain terminal 3 and formed by the input region 14, by the channel region 15, by the drift region 10, by the substrate 2 and by the drain terminal 3, connected together in series from an electrical standpoint. Associated with said current path is, in the ON phase, the ON resistance $R_{DSon}$, which, as described above, should be as low as possible in low reference voltage applications.

In this phase, typically, the resistances referred to above (input resistance Rin, channel resistance Rc, output resistance Ro, drift resistance Rd, and substrate resistance Rs) constitute main resistive components of the current path. Notwithstanding this, other resistive components may be comprised in the current path in a way that depends upon the design of the MOSFET device 1.

Generally, the input resistance Rin and the output resistance Ro are very low, since they are mainly formed by metal connection elements.

The channel resistance Rc is determined at the design stage by the physical dimensions and densities of electrical-charge carriers of the channel regions 15.

The drift resistance Rd determines the breakdown voltage of the MOSFET device 1 and is hence accurately chosen at the design stage by setting the thickness and doping level of the drift region 10, according to the desired breakdown voltage and the application of the apparatus in which the MOSFET device 1 is integrated.

The substrate resistance Rs constitutes an undesired resistance in the current path, especially in the low-voltage applications referred to above in which it is desired to have the ON resistance $R_{DSon}$ as low as possible.

In fact, in practice, the substrate 2 substantially has only a function of mechanical support, without which the MOSFET device 1 would be mechanically fragile both during the manufacturing steps and during the assembly step in electronic apparatuses.

Obviously, the substrate resistance Rs depends upon the thickness and doping level of the substrate 2.

Consequently, the current state of the art includes the possibility of thinning the substrate 2 or increasing the doping level thereof in order to reduce the value of the substrate resistance Rs to a minimum.

Thinning of the substrate 2, for example, via grinding, has, however, limitations. As mentioned above, in fact, the thickness of the substrate cannot be reduced to zero, in order not to compromise the mechanical strength of the MOSFET device, and consequently the resistance value cannot be reduced below a certain threshold.

On the other hand, increasing the doping level entails the introduction of further manufacturing steps and consequently the increase in manufacturing complexity of the power MOSFET devices and in the related costs.

A different solution is described in the U.S. patent US 2002/0197832 A1 and comprises trenches dug in the bottom part of the substrate of the power MOSFET device and filled with conductive material, such as copper or polysilicon. The trenches may be obtained, for example, via selective electrochemical removal.

In this way, the substrate of the device is formed by the alternation of regions of conductive material and semiconductor regions, electrically connected in parallel. The presence of the metal regions enables a reduction of the substrate resistance; at the same time, the mechanical stability of the substrate is guaranteed.

Also the above solution, however, does not enable sufficiently low resistance values to be obtained for certain applications.

BRIEF SUMMARY

In various embodiments, the present disclosure provides a vertical conduction electronic power device that will enable reduction of the ON resistance.

According to the present disclosure a vertical conduction electronic power device and a manufacturing process thereof are provided.

In at least one embodiment, a vertical conduction electronic power device is provided that includes a body having a first and a second surface and including an epitaxial layer of semiconductor material, and a substrate. The epitaxial layer is delimited by the first surface of the body and the substrate is delimited by the second surface of the body. The epitaxial layer houses at least a first and a second conduction region having a first type of doping. A plurality of insulated-gate regions extend over the first surface of the body or within the epitaxial layer. The substrate has at least one silicide region which extends from the second surface of the body towards the epitaxial layer.

In at least one embodiment, a method for manufacturing a vertical conduction electronic power device is provided that includes: forming a plurality of insulated-gate regions on a wafer of semiconductor material, the wafer including an epitaxial layer and a substrate and having a first and a second surface, the plurality of insulated-gate regions formed on the first surface of the wafer or within the epitaxial layer; forming a first and a second conduction region within the epitaxial layer; and forming, in the substrate, at least one silicide region, which extends starting from the second surface of the body towards the epitaxial layer.

In at least one embodiment, a device is provided that includes a substrate including a silicide layer. An epitaxial layer of semiconductor material is disposed on the silicide layer, and the epitaxial layer includes a drift region having a first doping type that is on and in contact with the silicide layer, an active region having a second doping type that is on the drift region, and a source region on the active region. The source region has the first doping type and has a higher concentration of the first doping type than the drift region. First and second insulated-gate regions extend into the drift region from a surface of the epitaxial layer, and the active region and the source region are disposed between and abutting the first and second insulated-gate regions.

BRIEF DESCRIPTION OF THE SEVERAL VIEWS OF THE DRAWINGS

For a better understanding of the present disclosure, some embodiments thereof are now described, purely by way of non-limiting example, with reference to the attached drawings, wherein:

FIGS. 2-7 are cross-sectional views of the present MOSFET device in successive manufacturing steps;

FIG. 8 shows a vertical conduction power MOSFET device in accordance with at least one embodiment; and FIG. 9 shows yet a further embodiment of the present vertical conduction power MOSFET device.

DETAILED DESCRIPTION

Described hereinafter are steps for manufacturing a vertical conduction power MOSFET device, which can be used in electronic apparatuses, especially apparatuses operating at low reference voltages.

Figure 1:
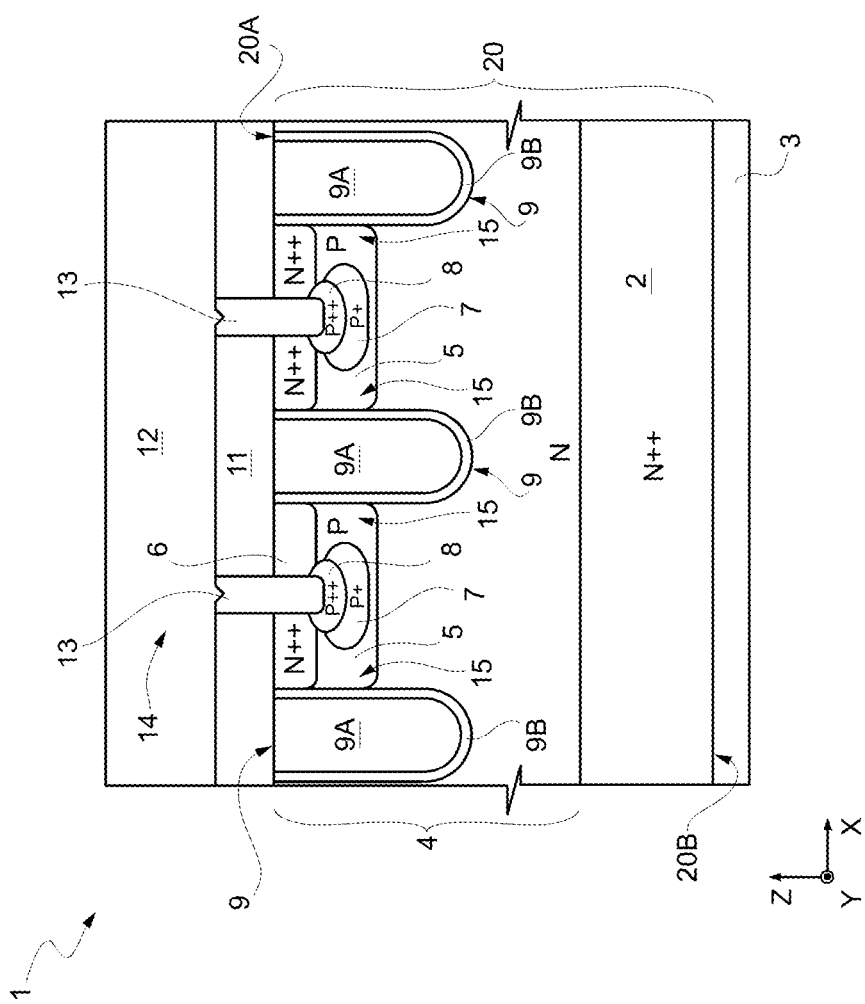
FIG. 1 is a cross-sectional view of a known vertical conduction power MOSFET device.

In particular, the manufacturing steps described below lead to the production of a MOSFET device having a general structure similar to the one illustrated in FIG. 1. Consequently, the elements that are in common with the ones already described with reference to FIG. 1 are designated by the same reference numbers increased by 50.

Figure 2:
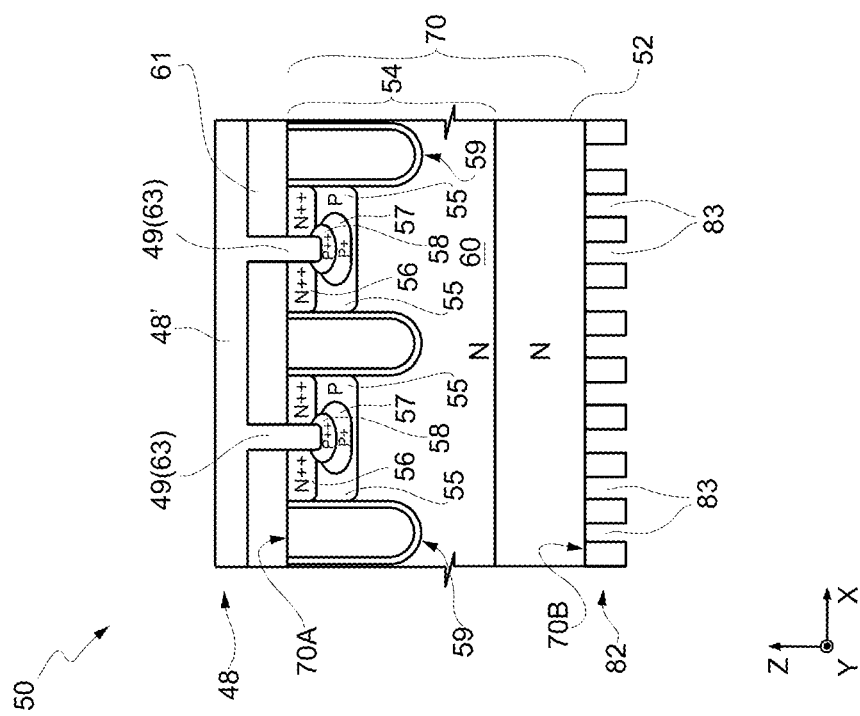

In detail, FIG. 2 is a cross-sectional view of a wafer 50 that has been processed in a way known to the person skilled in the art, for example, in a way similar to what is described in the European patent application No. 3396718. In particular, in the wafer 50 there have already been provided the substrate 52 and the epitaxial layer 54 (which form the body 70 having a first and a second surface 70A, 70B that coincide with the surfaces delimiting the wafer 50), the active regions 55, the source regions 56, the first and second enriched regions 57, 58, the insulated-gate regions 59, the drift region 60 and the dielectric insulation region 61. In addition, on the dielectric insulation region 61 a metal contact layer 48 has already been deposited, which fills contact trenches 49 dug in the dielectric insulation region 61 (where it forms the metal contact regions 63) and has a surface portion 48' that extends over the dielectric insulation region 61 itself.

Furthermore, a patterning layer 82, made, for example, of photosensitive material such as resist, has been deposited on the second surface 70B of the body 70 and has been patterned via lithographic processes to form a plurality of cavities 83, which have, for example, a circular cross-section with a diameter within a range from 0.5 μm to 3 μm, in some embodiments within a range from 1 μm to 2 μm.

Figure 3:
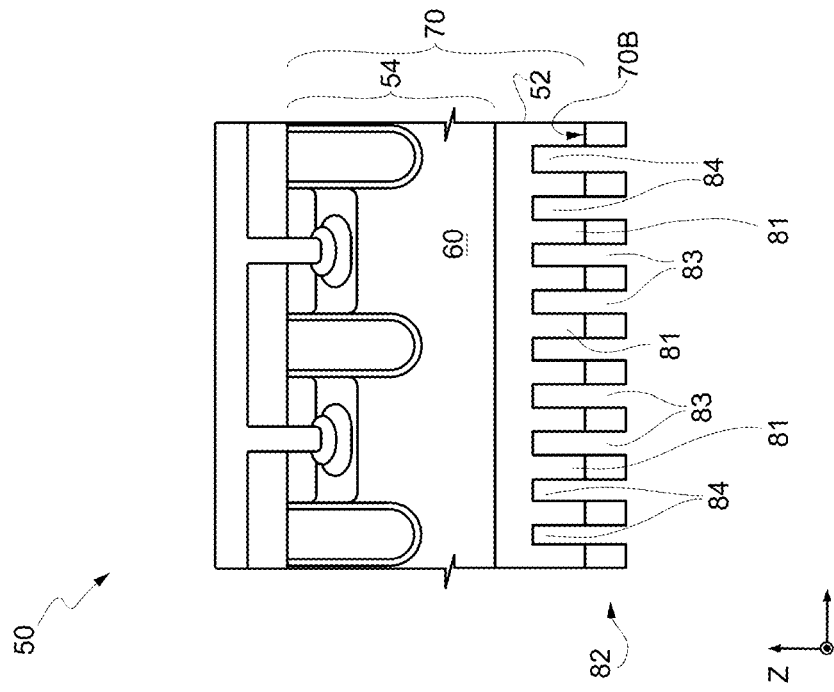

FIG. 3 shows the wafer 50 following a chemical etching carried out on the second surface 70B of the body 70. Chemical etching enables selective removal of portions of the substrate 52 at the cavities 83, thus forming a plurality of trenches 84 that extend along the first axis Z for a high depth. For instance, for a substrate having a depth of 250 μm, the trenches 84 may have a depth within a range from 150 μm to 250 μm; however, these values are not limiting, and the trenches 84 may extend throughout the entire thickness of the substrate until reaching a minimum distance from the epitaxial layer 54, typically not less than 1 μm. Likewise, in the case of a thinner or thicker substrate, the trenches 84 may extend only through part of the substrate 52 or until reaching a minimum distance from the epitaxial layer 54 of no less than 1 μm. In practice, the substrate 52 is now formed by the alternation of trenches 84 and semiconductor columns 81.

Formation of the trenches 84 can be carried out by means of processes known to the person skilled in the art such as, stain etching, metal-assisted chemical etching and reactive-ion etching.

Figure 4:
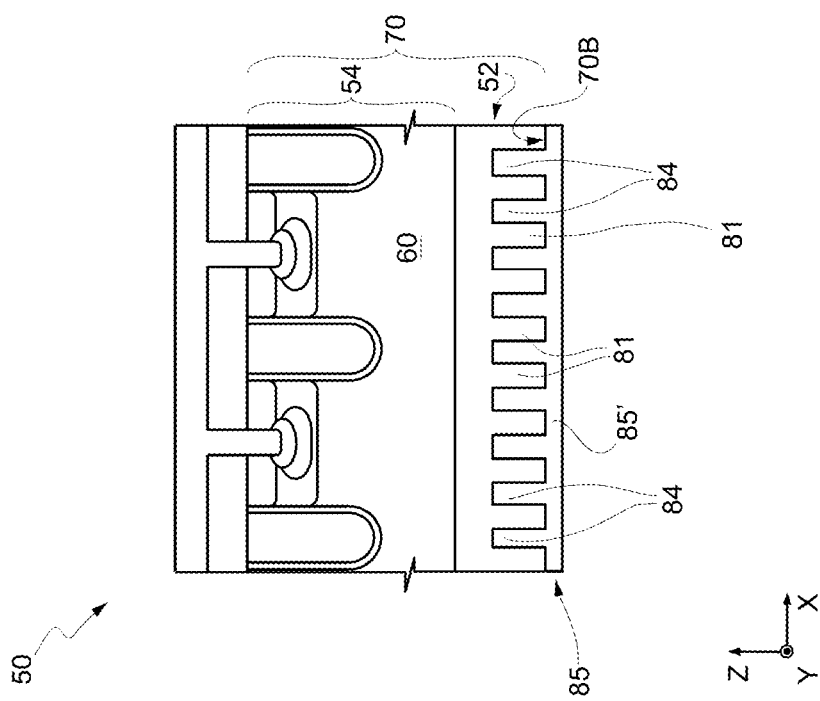

Next, as illustrated in FIG. 4, the patterning layer 82 is removed and a metal layer 85 of conductive material is deposited, for example, a transition metal, such as titanium or tungsten if the substrate 52 has a doping of an N-type, or cobalt or chromium if the substrate 52 has a doping of a P-type.

The metal layer 85 is deposited to completely fill the trenches 84 and form a surface portion 85' that covers the second surface 70B of the body 70.

Figure 5:
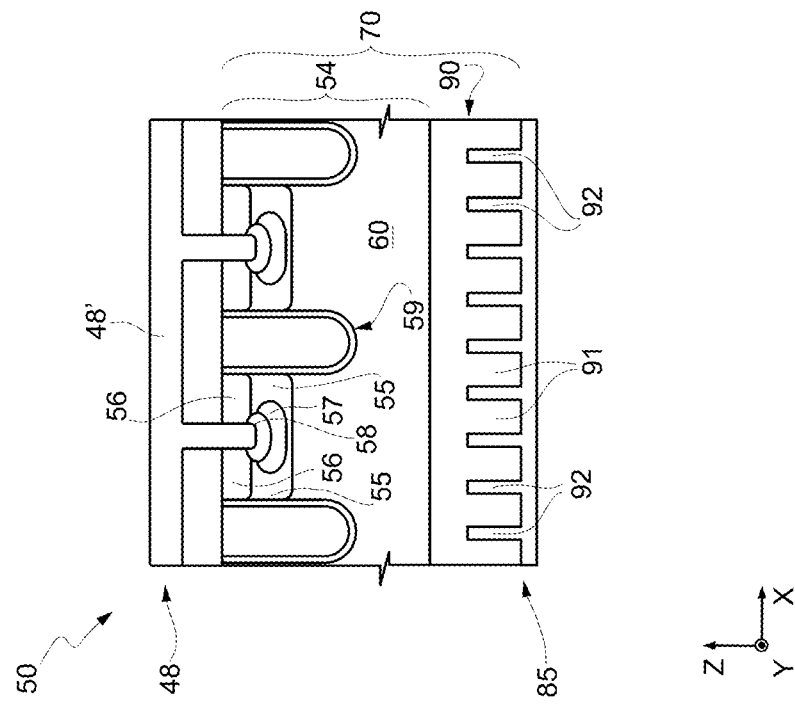

In FIG. 5, the wafer 50 is subjected to annealing, at a temperature within a range from 700° C. to 900° C., for a time, which depends upon the temperature, within a range from 1 minute to 2 minute.

The above thermal budget is sufficiently low not to affect the structures previously formed (active regions 55, source regions 56, first and second enriched regions 57, 58) but enables the portions of substrate 52 in contact with the metal layer 85 to chemically react with the metal layer 85 itself, to form a highly conductive silicide. For instance, in the case where the metal layer 85 is of titanium, titanium silicide (TiSi$_2$) is obtained. At the end of the annealing process, the entire substrate 52 has undergone the silicidation reaction. In this way, all the silicon of the substrate 52 has been transformed into silicide, while, in this embodiment, only part of the metal layer 85 in the trenches 84 has been consumed, also this having been transformed into silicide. The wafer 50 thus has, underneath the epitaxial layer 54, a metal drain layer 90 formed by silicide columns 91 (deriving from silicidation of the semiconductor columns 81 and of part of the metal of the trenches 84), which surround columns of metal material 92 (remaining portion of the metal layer 85, not reacted into silicide). Alternatively, according to the metals used, the dimensions and the process parameters, all the metal present in the trenches 84 may completely undergo the silicidation reaction, as shown hereinafter in FIG. 8.

The metal drain layer 90 thus formed has a conductivity that is higher than that of the doped semiconductor material, for example, N-doped silicon, of which the substrate 52 was made; this conductivity is also higher than in the case of a substrate having trenches filled with metal material surrounded by columns of semiconductor material, given that now the entire area of the metal drain layer 90 has an extremely high conductivity. In practice, the present solution enables a considerable reduction of the resistance Rs associated with the substrate 52, which now comprises a much larger surface with extremely low resistivity available for the flow of current.

Next, FIG. 6, the wafer 50 undergoes chemical etching according to processes known to the person skilled in the art, for example, anisotropic dry chemical etching, to remove the surface portion 48' of the metal contact layer 48. A first metallization layer 86, for example, of aluminium, is then deposited on the dielectric insulation region 61 and on the metal contact regions 63, thus forming the source terminal 62.

Finally, FIG. 7, a second and a third metallization layer 87, 88 are deposited in sequence on the metal drain layer 90, to form the drain terminal 53. The second metallization layer 87, for example, consisting of a compound of nickel and palladium or nickel and vanadium, favors the ohmic contact with the underlying metal layer 85. The third metallization layer 88, made, for example, of gold, silver or palladium, prevents oxidation of the first metallization layer 87.

The wafer 50 is then diced, and each resulting die, after usual steps of electrical connection and packaging, forms a MOSFET device 51.

Thanks to the fact that the substrate 52, now corresponding to the metal drain layer 90, consists completely of metal, as discussed above, the present MOSFET device 51 has a very low substrate resistance Rs, maintaining, at the same time, mechanical stability and low manufacturing costs. In fact, the manufacturing steps described above can easily be integrated in the process for manufacturing current power MOSFET devices and do not entail complex or costly manufacturing procedures.

FIG. 8 shows a MOSFET device 101 according to a further embodiment. The MOSFET device 101 has undergone manufacturing steps similar to those of the MOSFET device 51 and thus has a similar structure; consequently, the elements that are in common are designated by the same reference numbers. Here, at the end of annealing, all the metal present in the trenches 84 has reacted completely and also the area where the trenches were present is occupied by silicide. In practice, a silicide region 141 extends over the entire substrate 52 to form a metal drain layer 140, entirely consisting of silicide, arranged between the epitaxial layer 54 and the drain terminal 53. It is evident that also in this case the metal drain layer 140 has a particularly low substrate resistance Rs since it is entirely made of material with extremely low resistivity.

Alternatively, a MOSFET device 151 may be provided, as illustrated in FIG. 9. Also here, the elements that are in common with those of the MOSFET device 51 are designated by the same reference numbers. In this embodiment, the semiconductor columns 81 of FIG. 4 have completely reacted with the metal layer 85 to form silicide columns 91, while only part of the trenches 84 have reacted to form the columns of metal material 92, in a way similar to what is illustrated in FIG. 5. Unlike the MOSFET device 51, insulated-gate regions 109 have been obtained, in a way known to the person skilled in the art, on top of the epitaxial layer 54 and within the dielectric insulation region 61. Finally, it is clear that modifications and variations may be made to the MOSFET device 51, 101, 151 and to the manufacturing process described and illustrated herein, without thereby departing from the scope of the present disclosure. For instance, the various embodiments described may be combined to provide further solutions.

In addition, the manufacturing process described may be used for reducing the substrate resistance of other vertical conduction power devices, for example, devices that have a different design of the insulated-gate regions, where it is necessary or beneficial to have a resistance, of the current path between the two conduction terminals, that is, as low as possible.

Finally, the types of doping of the substrate, the epitaxial layer, the active regions, the source regions and the first and second enriched regions may be reversed.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A vertical conduction electronic power device, comprising:
   a body having a first and a second surface, the body including:
      an epitaxial layer, of semiconductor material of a first type of doping;
      a substrate, the epitaxial layer being between the first surface of the body and the substrate;
      a first conduction region in the epitaxial layer, the first conduction region having a second type of doping;
      a second conduction region in the epitaxial layer and overlapping the first conduction region, the second conduction region having the second type of doping and a different concentration than the first conduction region; and
      a plurality of silicide columns at the second surface;
   a first and a second insulated-gate region in the first surface, the first and second conduction regions being between the first and second insulated-gate regions;
   a metal layer on the plurality of silicide columns, the metal layer includes a plurality of metal columns that extend between ones of the plurality of silicide-columns, wherein a lateral space between each pair of adjacent metal columns is entirely filled by a respective silicide column from the plurality of silicide columns; and
   a first conduction terminal on the metal layer and in electrical contact with the metal layer.

2. The device according to claim 1, wherein the substrate is completely silicide.

3. The device according to claim 1, wherein the plurality of silicide columns collectively form the substrate, the plurality of silicide columns extend from the second surface of the body towards the epitaxial layer, at least partially surround the respective metal regions of the plurality of metal regions, and separate the adjacent respective metal regions of the plurality of metal regions from each other.

4. The device according to claim 1, wherein the plurality of silicide columns extend to the epitaxial layer.

5. The device according to claim 1, comprising a vertical conduction power transistor.

6. The device according to claim 1, further comprising:
   a second conduction terminal on the first surface of the body and in electrical contact with the first conduction region.

7. A method for manufacturing a vertical conduction electronic power device, comprising:
   forming a plurality of insulated-gate regions on a wafer of semiconductor material, the wafer including an epitaxial layer and a substrate and having a first and a second surface, the plurality of insulated-gate regions within the epitaxial layer;
   forming a first and a second conduction region within the epitaxial layer;
   forming a plurality of trenches in the substrate extending into the second surface towards the first surface, the plurality of trenches having respective ends closer to the epitaxial layer than the second surface of the substrate, respective adjacent trenches of the plurality of trenches are separated from each other by columns of semiconductor material of the substrate;
   forming a plurality of metal columns each in a respective trench by depositing a metal material within the plurality of trenches; and
   forming, in the substrate, a plurality of silicide columns, which extend starting from the second surface of the substrate towards the epitaxial layer, wherein a lateral space between each pair of adjacent metal columns is entirely filled by a respective silicide column from the plurality of silicide columns.

8. The method according to claim 7, wherein forming the plurality of silicide columns include:
   annealing the wafer and reacting the columns of semiconductor material with the metal material in the plurality of trenches.

9. The method according to claim 8, wherein the annealing is continued until all the columns of semiconductor material are transformed into silicide.

10. The method according to claim 8, wherein the annealing occurs at a temperature within a range from 700° C. to 900° C. for a time within a range from 1 minute to 2 minutes.

11. The method according to claim 8, wherein the trenches extend into the substrate to within 1 μm from the epitaxial layer.

12. The method according to claim 11, wherein the trenches extend into the substrate to a depth that is within a range from 150 μm and 250 μm and the trenches have a width within a range from 1 μm to 3 μm.

13. The method according to claim 8, wherein the substrate has a doping of an N-type and the metal material is one of titanium or tungsten.

14. The method according to claim 8, wherein the substrate has a doping of a P-type, and the metal material is one of cobalt or chromium.

15. The method according to claim 7, further comprising:
forming a second metallization region on the first surface, and
wherein forming the plurality of silicide columns is carried out after forming the first and second conduction regions and prior to forming the first metallization region and forming the second metallization region.

16. A device, comprising:
a substrate including a first surface opposite to a second surface;
a plurality of silicide columns at the second surface of the substrate;
an epitaxial layer of semiconductor material on the first surface of the substrate, the epitaxial layer including:
    a drift region on and in contact with the plurality of silicide columns, the drift region having a first doping type;
    an active region on the drift region, the active region having a second doping type that is different from the first doping type; and
    a source region on the active region, the source region having the first doping type and having a higher concentration of the first doping type than the drift region;
first and second insulated-gate regions extending into the drift region from a third surface of the epitaxial layer that is opposite to the first surface of the substrate, the active region and the source region disposed between and abutting the first and second insulated-gate regions; and
a metal layer including a plurality of metal columns that extend between the plurality of silicide columns towards the epitaxial layer, wherein a lateral space between each pair of adjacent metal columns is entirely filled by a respective silicide column from the plurality of silicide columns.

17. The device according to claim 16, further comprising a dielectric layer on the epitaxial layer.

18. The device according to claim 17, further comprising a conduction terminal extending through the dielectric layer and into the source region, the conduction terminal electrically coupled to the source region.

* * * * *